(12) United States Patent
Mardilovich et al.

(10) Patent No.: US 9,624,101 B2
(45) Date of Patent: Apr. 18, 2017

(54) ARTICLE WITH CONTROLLED WETTABILITY

(75) Inventors: Peter Mardilovich, Corvallis, OR (US); Anthony M. Fuller, Corvallis, OR (US); Qingqiao Wei, Corvallis, OR (US); Rio Rivas, Corvallis, OR (US); David Kamp, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 818 days.

(21) Appl. No.: 13/878,205

(22) PCT Filed: Oct. 21, 2010

(86) PCT No.: PCT/US2010/053529
§ 371 (c)(1),
(2), (4) Date: Apr. 6, 2013

(87) PCT Pub. No.: WO2012/054039
PCT Pub. Date: Apr. 26, 2012

(65) Prior Publication Data
US 2013/0192993 A1    Aug. 1, 2013

(51) Int. Cl.
*B82B 3/00* (2006.01)
*C25D 11/02* (2006.01)
(Continued)

(52) U.S. Cl.
CPC ........ *B82B 3/0014* (2013.01); *B81C 1/00206* (2013.01); *C25D 11/022* (2013.01);
(Continued)

(58) Field of Classification Search
CPC . B81B 2201/052; B82B 3/0014; C25D 11/12; C25D 11/18; C25D 11/26; C25D 11/022
See application file for complete search history.

(56) References Cited

U.S. PATENT DOCUMENTS 7,488,671 B2    2/2009    Corderman et al.
7,572,669 B2    8/2009    Tuominen et al.
(Continued)

FOREIGN PATENT DOCUMENTS

CN    101603177    12/2009
KR    20040088901    10/2004
(Continued)

OTHER PUBLICATIONS

Choi et al; Fabrication of a Dense Array of TAll Nanostructures Over a Large Sample Area With Sidewall Profile and Tip Sharpness Control; Mechanical and Aerospace Engineering Depart., Univ. of CA at LA, Oct. 6, 2006, vol. 17.
(Continued)

*Primary Examiner* — Louis Rufo
(74) *Attorney, Agent, or Firm* — HP Inc. Patent Department

(57) ABSTRACT

An article is provided, the article including a substrate having a surface with a first wettability characteristic. A nano-structure array is formed on the surface of the substrate to provide a nano-structured surface having a second wettability characteristic. A thin-layer surface coating is formed on the nano-structured surface, the thin-layer surface coating being configured to tune the nano-structured surface to a target wettability characteristic.

4 Claims, 6 Drawing Sheets

(51) Int. Cl.
  *C25D 11/04* (2006.01)
  *C25D 11/26* (2006.01)
  *B81C 1/00* (2006.01)
(52) U.S. Cl.
  CPC ............ *C25D 11/045* (2013.01); *C25D 11/26* (2013.01); *B81B 2201/052* (2013.01); *B81B 2203/0353* (2013.01)

(56) References Cited

U.S. PATENT DOCUMENTS

| | | | |
|---|---|---|---|
| 7,686,885 B2 | 3/2010 | Ku et al. | |
| 2006/0255171 A1* | 11/2006 | Krupenkin | B01D 69/06 239/44 |
| 2006/0275955 A1* | 12/2006 | Ku | B82Y 10/00 438/128 |
| 2009/0034122 A1* | 2/2009 | Ichihara | B82Y 10/00 360/131 |
| 2010/0047523 A1* | 2/2010 | Kim | B05D 5/08 428/144 |
| 2010/0304132 A1* | 12/2010 | Kobrin | B05D 1/185 428/336 |

FOREIGN PATENT DOCUMENTS

| | | | |
|---|---|---|---|
| KR | 20040088901 A * | 10/2004 | ........... Y02T 70/121 |
| KR | 20050010820 | 1/2005 | |
| KR | 20060003006 | 1/2006 | |
| WO | WO-2010022107 | 2/2010 | |

OTHER PUBLICATIONS

Kim, J. et al; Nanostructured Surfaces for Dramatic Reduction of Flow Resistance in Droplet-Based Microfluidics; The Fifteenth IEEE International Conference on Micro Electro Mechanical Systems, Jan. 20-24, 2002, pp. 479-482.

Piret, G. et al.; Matrix-Free Laser Desorption/Ionization Mass Spectrometry on Silicon Nanowire Arrays Prepared by Chemical Etching of Crystalline Silicon; Langmuir, Aug. 27, 2009, vol. 26(2), pp. 1354-1361.

* cited by examiner

ARTICLE WITH CONTROLLED WETTABILITY

BACKGROUND

The present disclosure relates generally to wettability of articles, and more particularly, to the wettability of surfaces characterized by materials and/or surface treatments which may not immediately lend themselves to a desired wettability behavior.

Surface wettability is a critical factor in micro-fluidic devices. For example, wetting characteristics of certain surface portions on an orifice plate of an inkjet printhead can impact printhead performance. Specifically, surface portions immediately surrounding orifices of a printhead orifice plate should be non-wetting so that residual fluid in those regions will bead up away from the orifices, and will not interfere with subsequent ejection through the orifices. Other surface portions should be wetting so that residual fluid will flow off of the orifice plate. It is not always possible, however, to select a material with a desired wettability characteristic for the printhead orifice plate.

BRIEF DESCRIPTION OF THE DRAWINGS

Features and advantages of embodiments of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Figure 1A:
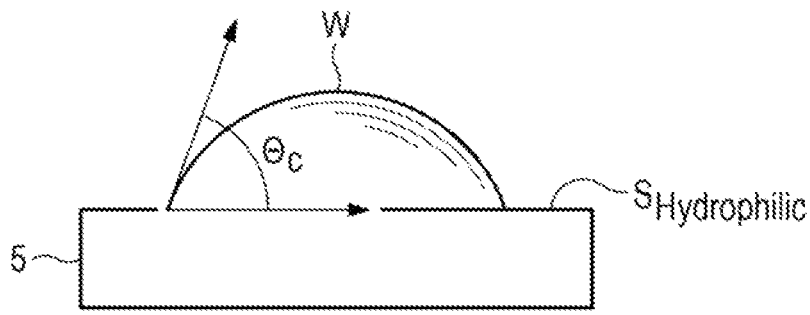
FIGS. 1A-1C schematically illustrate contact angles for hydrophilic, hydrophobic and superhydrophobic surfaces.
Figure 1B:
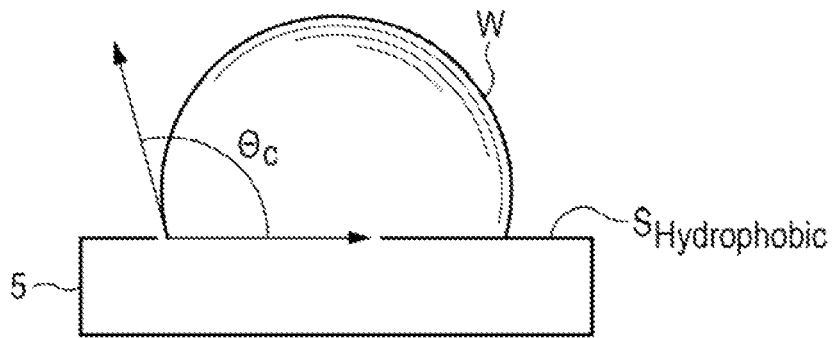
Figure 1C:
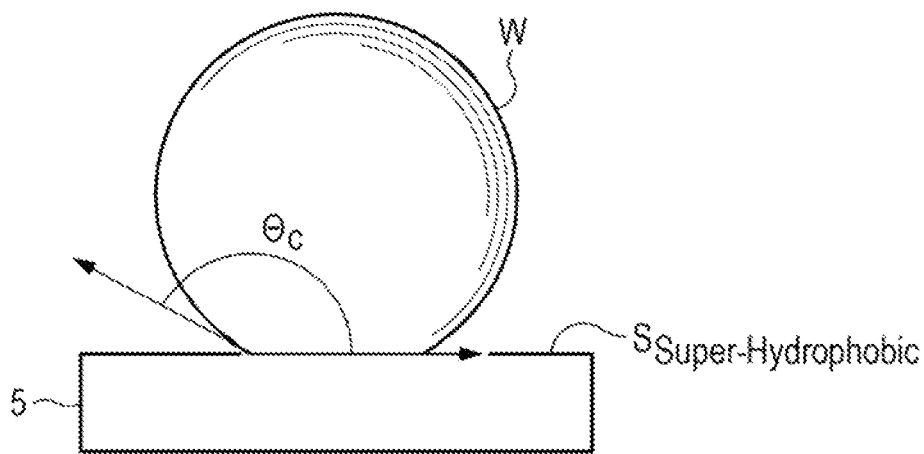

Referring initially to FIGS. 1A-1C, illustrations are provided schematically showing behavior of water droplets on example hydrophilic, hydrophobic and super-hydrophobic surfaces.

In FIG. 1A, for example, a water droplet W is shown on a substrate 5, where the substrate has a hydrophilic surface $S_{Hydrophilic}$. Under these circumstances, surface wetting is favored, meaning that the droplet will spread out over a large area of the surface. As shown, this results in a droplet characterized by a contact angle $\theta_C$ (the angle at which the liquid-vapor interface meets the solid-liquid interface) that is less than 90°.

In FIG. 1B, water droplet W is shown on a substrate 5, where the substrate has a hydrophobic surface $S_{Hydrophobic}$. Here, surface wetting is disfavored, meaning that the droplet will minimize contact with the surface and will form a more compact droplet. As shown in FIG. 1B, a hydrophobic surface results in a water droplet characterized by a contact angle $\theta_C$ that is greater than 90°.

FIG. 1C shows water droplet W on a substrate 5, where the substrate has a super-hydrophobic surface $S_{Super-Hydrophobic}$. Such super-hydrophobic surface is highly resistant to surface wetting, and thus may be seen to have almost no contact between the water droplet and the surface. As shown in FIG. 1C, a super-hydrophobic surface generally results in a droplet characterized by a contact angle $\theta_C$ that is greater than 150°.

The forgoing concepts similarly apply to surfaces in relation to non-water liquids. A surface thus may more generally be referred to as wetting (or omniphilic) where the surface favors wetting by water, oil and/or other fluids. A surface may more generally be referred to as non-wetting (or omniphobic) where the surface is resistant to wetting by water, oil and/or other fluids. Non-wetting surfaces have a surface energy that is much less than that of the fluid (e.g., water) that is in contact with the non-wetting surface. A surface having a contact angle $\theta_C$ which is greater than 150° may be referred to as "super-omniphobic", meaning that the surface is highly resistant to wetting by water, oil and/or other fluids.

In accordance with our teachings, wettability of a surface can be changed by adding nano-structures to the surface. Nano-structures may be formed using a nano-structure template, including nano-pores which may be at least partially filled to define nano-structures therein. For example, electromechanical oxidation of a multilayer metal substrate, accompanied by selective etching, can allow fabrication of a nano-structure template suitable for formation of an array of substantially uniform nano-structures on a surface (or surfaces) of the substrate. Placement of nano-structures also may be controlled such that the nano-structures are substantially uniformly spaced. Substantially uniform spacing minimizes differential wettability characteristics of the substrate surface. Nano-structure dimensions generally will vary by less than 10% to 20% (for nanometer scale dimensions), and in some examples, may vary by as little as 1% or 2%.

As described below, wettability of a surface including nano-structures can be further tuned by applying a thin-layer coating to the nano-structure array. The thin-layer coating may be selected based on a target wettability characteristic of the substrate surface, and can be applied such that the target wettability characteristic is substantially uniformly achieved across the substrate surface.

Figure 2:
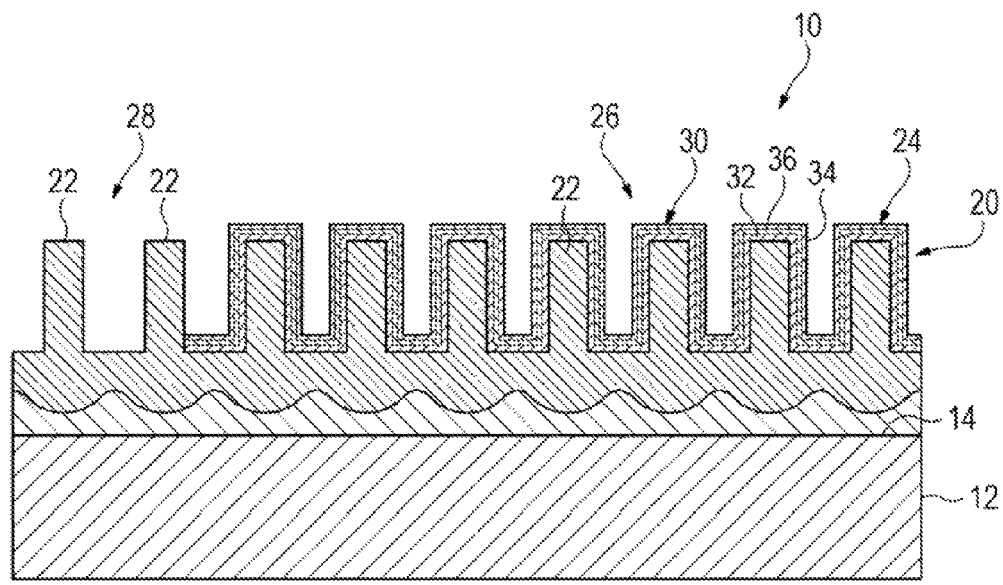
FIG. 2 is a cross-sectional view of an article including nano-structures with a surface coating configured to tune surface wettability in accordance with an embodiment of the present invention.

Referring to FIG. 2, an example article 10 is illustrated, the depicted article including a substrate 12 having a surface 14. Substrate surface 14 may be characterized by a first wettability characteristic, based at least in part on the physical and chemical properties of the material that forms the substrate. For example, a substantially planar substrate formed of a material such as silicon (Si) may be employed, and may be characterized by a wettable (hydrophilic) surface having a contact angle $\theta_C$ for water on the order of 66°. It is to be understood that substrate 12 is shown for illustrative purposes only, and may not be drawn to scale. Suitable substrates may be formed from other materials, and may take other forms.

As indicated, a nano-structure array 20 may be formed on substrate surface 14, the depicted nano-structure array including a plurality of substantially uniform nano-structures 22. In the present example, nano-structures 22 take the form of columnar nano-pillars that extend substantially orthogonal to the substrate surface 14. The nano-pillars are substantially uniformly spaced across at least a portion of substrate surface 14 to define a nano-structured surface 24. Due at least in part to the changed surface morphology, nano-structured surface 24 may be characterized by a second wettability characteristic, which may be different from the first wettability characteristic (of substrate surface 14). The nano-structured surface 24 will be understood to have increased surface area relative to substrate surface 14, and will be understood to have a geometry which may modify surface wettability.

Although the nano-structures take the form of columnar nano-pillars in FIG. 2, other nano-structure geometries are possible. For example, by adjusting one or more parameters of the nano-structure fabrication process disclosed herein, height, width, shape, and spacing between nano-structures may be adjusted. Changes in these geometries may impact wettability of the nano-structured surface, providing a first variable for controlling the wettability of the nano-structured surface.

The nano-structured surface may be treated, by application of a surface coating, to tune wettability of the nano-structured surface. As shown in FIG. 2, a thin-layer surface coating 30 thus may be applied to the nano-structured surface and may conform to the shape of the nano-structured surface so as not to substantially alter geometry of the nano-pillars. Surface coating 30 may be of a material selected to achieve a target wettability characteristic, which may be defined by a desired fluid contact angle $\theta_C$, or range of fluid contact angles. Aspects of the thin-layer surface coating thus provide a second variable for controlling the wettability of the nano-structured surface 24.

Where, as in the present example, the nano-structures are formed of tantalum pentoxide ($Ta_2O_5$), an untreated nano-structured surface (before application of a thin-layer surface coating described below) may be characterized by a hydrophilic (wettable) surface having a water contact angle on the order of 20°. Such an untreated nano-structured surface thus may be substantially more wettable than surface 14 of the example silicon substrate 12.

Figure 2A:
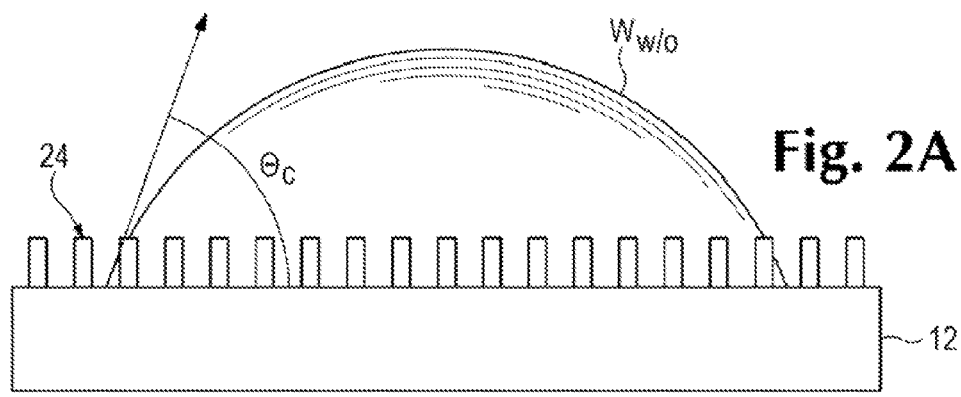
FIG. 2A is a cross-sectional view of an article including nano-structures configured to provide a surface having a hydrophilic wetting characteristic.

FIG. 2A depicts a substrate 12 having an untreated nano-structured surface 24. An example fluid droplet $W_{W/O}$ is applied to the untreated nano-structured surface, the fluid droplet $W_{W/O}$ having a contact angle $\theta_C$ on the order of 20°. Due to the substantially uniform structures and spacing, the untreated nano-structured surface may be characterized by substantial uniformity of water contact angle across the entire nano-structure array (e.g., the water contact angle may have a standard deviation of approximately 1°).

Figure 2B:
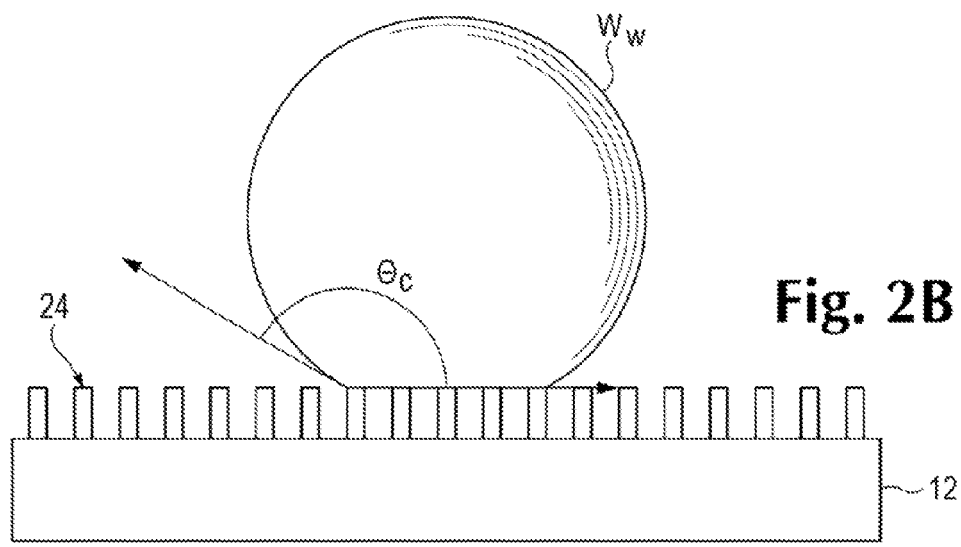
FIG. 2B is a cross-sectional view of an article including nano-structures configured to provide a surface having a hydrophobic wetting characteristic.

In the example described herein, the thin-layer surface coating 30 effects a change in the nano-structured surface from a hydrophilic surface, having a water contact angle on the order of 20°, to a hydrophobic surface, having a water contact angle approaching 150°. FIG. 2B shows a substrate 12 having a nano-structured surface 24 treated with thin-layer surface coating 30. An example fluid droplet $W_w$ is applied to the treated nano-structured surface, the fluid droplet $W_W$ having a contact angle $\theta_C$ on the order of 150°.

In some examples, depending on the particular geometry of the nano-structures 22, the thin-layer surface coating 30 may change the nano-structured surface 24 from a hydrophilic surface to a super-hydrophobic surface having a water contact angle greater than 150°. Other target wettability characteristics, defined by particular fluid contact angles, or fluid contact angle ranges, also are possible.

Thin-layer surface coating 30 may be formed of any of a variety of materials suitable for tuning wettability of nano-structured surface 24. Such thin-layer surface coating may substantially entirely cover the nano-structured surface, or may cover only selected portions of the nano-structures (e.g., only the tops of nano-pillars 22), or only selected regions of the nano-structure array.

FIG. 2 illustrates a nano-structured surface 24 having a first region 26 that is covered by thin-film layer 30 and a second region 28 that is not covered by thin-film layer 30. Accordingly, wettability of covered region 26 may be differentially tuned toward the target wettability characteristic, relative to the first region 28 (which may have a wettability characteristic unchanged from the second wettability characteristic). Where nano-structures are formed of a material such as tantalum pentoxide ($Ta_2O_5$), the nano-structured surface may be characterized by an omniphobic wettability characteristic in the first region 26 (where the thin-layer surface coating includes a self-assembled monolayer chemically bonded to the nano-structured surface), and may be characterized by an omniphilic wettability characteristic in the second region 28 (where the nano-structured surface is uncovered).

Surfaces with differential wettability characteristics may be defined by adjacent adjoining flat surface regions (not shown) and nano-structured surface regions. The adjoining surface regions may both be coated with a thin-layer surface coating (where the thin-layer surface coating includes a self-assembled monolayer chemically bonded to both surface regions), or one surface portion may be coated while the other is not coated. A variety of surface patterns including surface regions of differential wettability characteristics may be formed.

Thin-layer surface coating 30 may include a single layer, or may include plural layers, selected to provide the nano-structured surface with a target wettability characteristic. In FIG. 2, thin-layer surface coating 30 is shown to include a first layer 32 and a second layer 34 and an intermediate layer 36. Additional layers may be employed, for example, to chemically alter the surface of the nano-structured surface, to alter geometry of the nano-structured surface 24 and/or to prepare the nano-structured surface for receipt of additional layers of the thin-layer surface coating.

First layer 32 may be formed of a material such as, for example, hafnium oxide ($HfO_2$), silicon oxide ($SiO_2$), zinc oxide (ZnO), aluminum oxide ($Al_2O_3$), titanium oxide ($TiO_2$), zirconium oxide ($ZrO_2$) or tungsten (W), and may be selected to chemically alter nano-structured surface 24 and/or to adhere the second layer 34 to nano-pillars 22.

Second layer 34 may be a self assembled monolayer formed of a material such as 1H,1H,2H,2H-perfluorodecyltrichlorosilane (FDTS), heptadecafluoro-1,1,2,2-tetrahydrodecyl trichlorosilane (HDTS), tridecafluoro-1,1,2,2-tetrahydrooctyl trichlorosilane (FOTS) or octadecyltrichlorosilane (OTS). Because second layer 34 may not readily adhere to substrate 12, first layer 32 may be selected to prepare the nano-structured surface 24 for application of second layer 34. Alternatively, or additionally, an intermediate layer 36 may be applied over first layer 32 to prepare the nano-structured surface for receipt of second layer 34.

In FIG. 2, a first layer of hafnium oxide ($HfO_2$) is applied to nano-structured surface 24 to chemically alter the nano-structured surface. First layer 32 is on the order of 3 nanometers to 6 nanometers thick. A second layer of 1H,1H, 2H,2H-perfluorodecyltrichlorosilane (FDTS) is applied over the first layer. The second layer 34 is a self-assembled monolayer, and is adhered to first layer 32 via an intermediate monolayer of silicon oxide (SiO$_2$) configured to chemically bond second layer 34 to first layer 32.

Although a multi-layer thin-layer coating is employed in the present example, as noted above, the thin-layer surface coating may employ any number of layers, including a single layer. For example, thin-layer surface coating 30 may be formed of a self-assembled monolayer of FDTS may be applied directly to nano-structures, where the nano-structures are suitable for receipt of the self-assembled monolayer of FDTS, and the target wettability characteristic is achievable by application of a single layer of FDTS. Similarly, thin-layer surface coating 30 may be a single layer of hafnium oxide (HfO$_2$) applied directly to a nano-structured surface suitable for receipt thereof, where the target wettability characteristic is achievable by application of a single layer of hafnium oxide.

Also, although first layer 32, second layer 34 and intermediate layer 36 are shown to be of comparable thickness, the depicted layers are shown for illustrative purposes only. Layers may be thinner or thicker than illustrated, and the depicted layers are not drawn to scale. The thin-layer surface coating may be formed to a thickness that is up to half the distance between nano-pillars.

FIGS. 3A-3E depict wettability-controlled article 40 through various stages of fabrication. A substrate 50 thus may be adapted, through the present method, to include a nano-structured surface that exhibits a target wettability characteristic in accordance with a desired use. Accordingly, article 40 may be fabricated to define a nano-structured surface tuned to a target hydrophilic, hydrophobic or super-hydrophobic wettability characteristic.

Figure 3A:
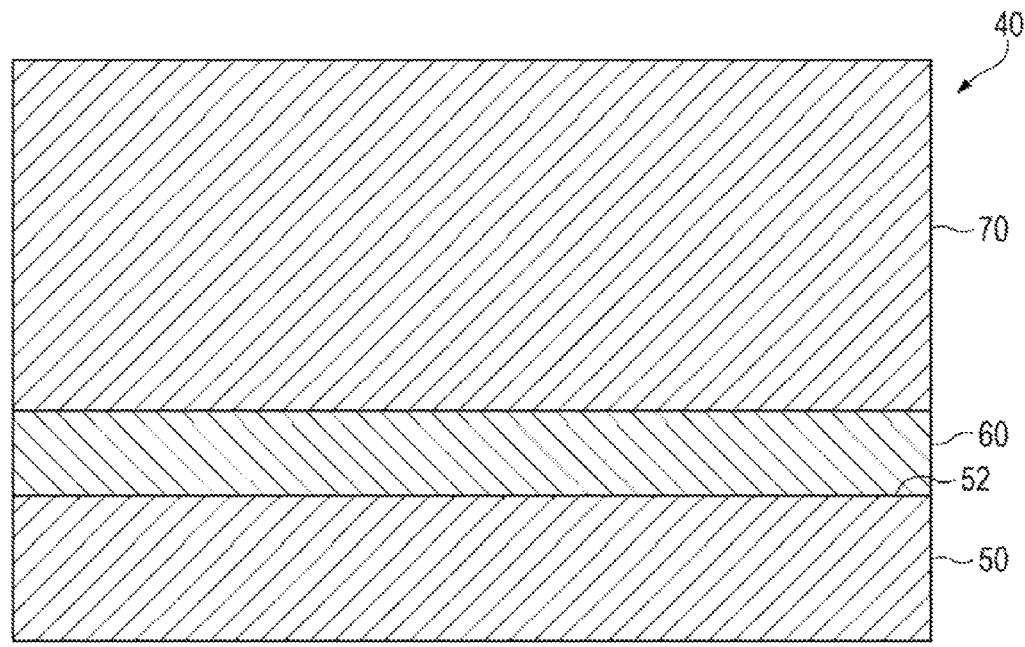
FIGS. 3A-3E schematically depict a method for fabricating the article of FIG. 2 in accordance with an embodiment of the present invention.

Referring initially to FIG. 3A, fabrication begins with a substrate 50, the substrate having a surface 52. Substrate surface 52 may be characterized by a first wettability characteristic, depending upon the material from which substrate 50 is formed, and the particular geometry of surface 52.

Substrate 50 may be selected based, at least in part, on the application for which article 40 will ultimately be used. If, for example, article 40 is to be used for semiconductor applications, substrate 50 may be formed from suitable support structures for semiconductors, such as a substantially planar silicon wafer. Substrate 50 similarly may be formed from other materials, e.g., glass, quartz, alumina, stainless steel, plastic, and/or the like, and may take any of a variety of forms, including a multilayer structure and/or a structure with a non-planar surface. In the example embodiment, a substantially planar substrate is shown (meaning that the surface is flat but may contain some irregularities).

A first oxidizable material is deposited on substrate surface 52 to form a first oxidizable material layer 60. First oxidizable material layer 60 may be formed using any suitable deposition technique. Some non-limiting examples of suitable deposition techniques include physical vapor deposition (PVD) (such as sputtering, thermal evaporation and pulsed laser deposition), atomic layer deposition (ALD), or, in some instances, chemical vapor deposition (CVD).

The first oxidizable material layer 50 may be formed of a metal or metal alloy that forms a dense metal oxide after electrochemical oxidation. Suitable oxidizable materials include oxidizable refractory metals such as tantalum (Ta), niobium (Nb), titanium (Ti), tungsten (W), or their alloys. It will be appreciated that such oxidizable materials all can be electrochemically and/or thermally oxidized, and all have expansion coefficients (the ratio between thickness of the grown oxide and thickness of the consumed material) that are greater than 1.

In the present example, first oxidizable material layer 60 is formed of tantalum (Ta), which has been found suitable for use in the method described herein. The example first oxidizable material layer also is referred to herein as the "Ta layer". The Ta layer may have any suitable thickness that will produce (during electrochemical oxidation) enough oxide to form the nano-structures (which will be described in further detail below). In some embodiments, the thickness of the Ta layer may be approximately 50 to 1000 nanometers.

Referring still to FIG. 3A, a second oxidizable material is deposited on the Ta layer to form a second oxidizable material layer 70. The second oxidizable material layer may have a thickness selected to produce a porous oxide (as described below), which corresponds to the desired nano-structures to be formed. The second oxidizable material may be aluminum (Al), or may be an aluminum alloy such as an alloy having aluminum as the main component. Second metal oxide layer 70 also is referred to herein as the "Al layer". The Al layer may have any suitable thickness that will produce (during electrochemical oxidation) enough oxide to form a template sufficient to produce the nano-structures. In some embodiments, the thickness of the Al layer may be approximately 100 to 1000 nanometers.

Deposition of the second oxidizable material layer on the first oxidizable material layer may be accomplished using any suitable deposition technique. Some non-limiting examples of suitable deposition techniques include physical vapor deposition (PVD) (such as sputtering, thermal evaporation and pulsed laser deposition).

Figure 3B:
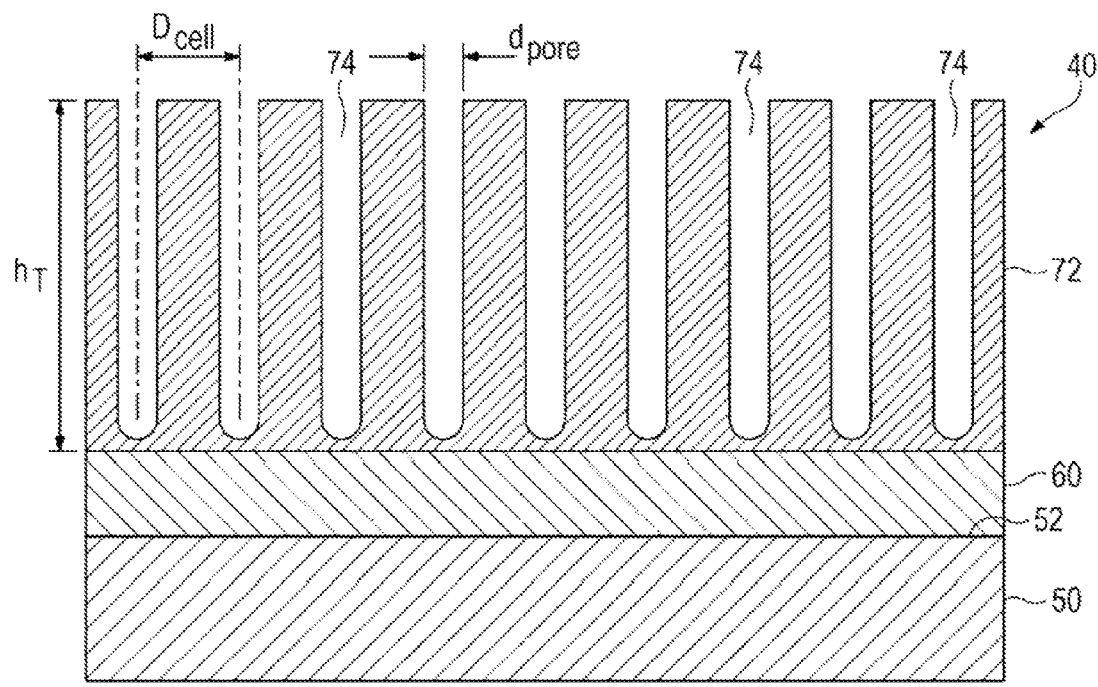

As shown generally in FIG. 3B, the multi-layer structure of FIG. 3A may be further processed to form a nano-structure template 72 on substrate 50 for use in fabricating nano-structures on substrate surface 52. Nano-structure template 72 defines a plurality of nano-pores 74, each having a width (indicated as nano-pore diameter ($d_{pore}$), in the present example). Nano-pores 74 are substantially uniformly spaced, such spacing being indicated as cell pitch $D_{cell}$.

In some embodiments, further processing includes a first anodization process whereby second metal oxide layer 70 is anodized to form a plurality of substantially uniform, cylindrical nano-pores. Such nano-pores may be formed by completely anodizing the second oxidizable material layer 70 (e.g., the Al layer) so as to produce a nano-structure template 72 in the form of a layer of porous oxide (e.g., anodic porous alumina, Al$_2$O$_3$) with nano-pores 74. Complete anodization refers to the oxidation through the layer being anodized sufficient to allow formation of nano-structures in the nano-pores 74 from the bottom up (although a barrier layer will remain, as shown).

Anodization (i.e., electrochemical oxidation) is a process of forming an oxide layer on a material by making the material the anode in an electrolytic cell and passing an electric current through the cell. For anodization of aluminum, as in the present example, applied voltage may be kept constant at voltage within a range of about 10 V to 200 V. In some examples, the first anodization process may occur at a voltage of about 30 V.

As indicated generally above, it is possible to adjust geometry by adjusting parameters of the fabrication process. For example, geometry of the nano-structure template 72 may be adjusted by varying one or more of anodization voltage, current density and electrolyte. Such adjustments to the first anodization process may alter nano-pore pitch ($D_{cell}$) and/or nano-pore diameter ($d_{pore}$), which characteristics are illustrated in FIG. 3B. Nano-pore pitch ($D_{cell}$) generally may be adjusted within a range of from about 30 nanometers to about 500 nanometers. Nano-pore diameter ($d_{pore}$) generally may be adjusted pore, within a range of from about 10 nanometers to about 350 nanometers.

Anodization can be performed at constant current (galvanostatic regime), at constant voltage (potentiostatic regime) or at some combination of these regimes. Nano-pore diameter ($d_{pore}$) is proportional to anodization voltage. Accordingly, a potentiostatic regime may be employed to produce a porous substrate with nano-pores having substantially uniform nano-pore diameter ($d_{pore}$). Substantially uniform nano-pores 74, in turn, will yield substantially uniform nano-pillars, as will be described below.

The first anodization process may be carried out by exposing Al layer 70 to an electrolytic bath containing an oxidizing acid such as sulfuric acid ($H_2SO_4$), phosphoric acid ($H_3PO_4$), oxalic acid ($C_2H_2O_4$), and/or chromic acid ($H_2CrO_4$). The electrolyte may be present, for example, in a water-based solution. The voltage applied during the first anodization process may be selected based on the electrolyte composition. For example, the voltage may range from 5-25V for an electrolyte based on sulfuric acid, 10-80V for an electrolyte based on oxalic acid, and 50-150V for an electrolyte based on phosphoric acid. The particular voltage used will depend on the desired pore diameter (and the suitability of such voltage for the electrolyte).

Nano-pore diameter ($d_{pore}$) also is related to the nature of the electrolyte used. Accordingly, an electrolyte may be selected to achieve a particular desired nano-pore diameter ($d_{pore}$). As non-limiting examples, nano-pores 74 of the following sizes may be obtained using the following electrolytes: nano-pore diameters ($d_{pore}$) of about 20 nanometers may be obtained using $H_2SO_4$ (in a water-based solution) as the electrolyte; nano-pores diameters ($d_{pore}$) of about 40 nanometers may be obtained using oxalic acid ($C_2H_2O_4$) (in a water-based solution) as the electrolyte, and nano-pores diameters ($d_{pore}$) of about 120 nanometers may be obtained using $H_3PO_4$ (in a water-based solution) as the electrolyte.

In one example, nano-structure template 72 is formed by anodization of the second oxidizable material layer 70 in a 4% solution of oxalic acid ($C_2H_2O_4$), at a voltage of 30 Volts. For a suitably thick Al layer, the resulting nano-structure template 72 will define nano-pores 82 that are approximately 30 nanometers wide, and that will allow oxidation of underlying first oxidizable material layer 60. Nano-structure template 72 should have a template height ($h_T$) sufficient to allow complete growth of nano-pillars within the nano-pores, as described below.

In some embodiments, prior to performing the first anodization process, the first oxidizable material layer may be patterned to precisely define locations of nano-pores 74 in the resulting nano-structure template 72. Patterning may be accomplished via any suitable technique. The patterned layer (not shown) is then anodized, for example, by employing the patterned layer as the anode of an electrolytic cell. A suitable amount of voltage and current is then applied to the electrolytic cell for an amount of time to completely anodize the patterned layer in accordance with the first anodization process described above. This can result in substantially uniformly spaced nano-structures where the variance in spacing between nano-structures differs by as little as 1% or 2% (for nanometer scale dimensions).

In some embodiments, the width of the nano-pores 74 may be further controlled via anisotropic etching after the first anodization is complete. Anisotropic etching may be performed using, for example, diluted phosphoric acid (5 vol. % ($H_3PO_4$)). The time for etching may vary, depending, at least in part, upon the desired average diameter for the final nano-pores. In one embodiment, the anisotropic etching time ranges from about 1 minute to about 30 minutes. The temperature for etching may also depend upon the process, desired etching rate and etchant used.

Figure 3C:
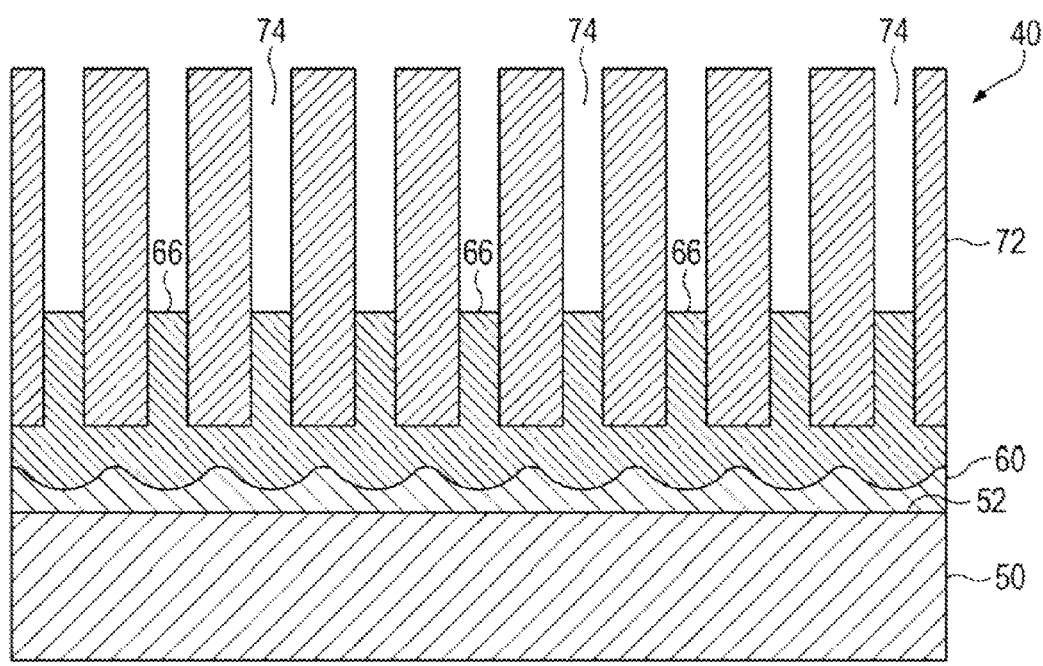

Referring now to FIG. 3C, nano-pores 74 may be at least partially filled to define nano-structures 66. Nano-structures 66 may be formed by a second anodization process similar to the first anodization process described above. More specifically, the first oxidizable material layer 60 is anodized by employing the first oxidizable material layer as the anode of an electrolytic cell to achieve a desired oxidation of the first oxidizable material. The orientation of nano-structures 66 is generally controlled by the orientation of the nano-pores 74. In the present example, nano-structures 66 are substantially orthogonal to the substrate surface 52.

The second anodization process may be used to grow oxide from the first oxidizable material, the oxide forming in nano-pores 74. Where the first oxidizable material layer 60 is formed of a material such as tantalum (Ta), the resulting oxide may take the form of a dense oxide such as anodic tantalum pentoxide ($Ta_2O_5$). Tantalum pentoxide has a significant expansion coefficient (approximately 2.3) as compared to tantalum, resulting in growth of the nano-structures 66 in nano-pores 74 from the bottom up.

For oxidation of tantalum, non-limiting examples of suitable electrolytes may include citric acid ($C_6H_8O_7$), boric acid ($H_3BO_3$), oxalic acid ($C_2H_2O_4$), ammonium pentaborate (($NH_4)_2B_{10}O_{16} \times 8H_2O$), and/or ammonium tartrate ($H_4NO_2CCH(OH)CH(OH)CO_2NH_4$). The electrolyte may be present, for example, in a water-based solution. It is to be understood that this type of anodization forms a dense oxide, where both the interface between the remaining first oxidizable material and the formed oxide, and the interface between the formed oxide and the electrolyte are planarized. As shown, some residual oxidizable material may remain below the formed oxide after the second anodization (FIG. 3C).

As indicated generally above, the configuration/structure of the nano-pores 74 generally will control the geometry and/or dimensions of the individual nano-structures 66. For instance, nano-structure template 72 may be formed so that the nano-pores 74 have substantially uniform diameter and substantially uniform pitch. Because the layer of porous oxide (e.g., anodic porous alumina ($Al_2O_3$)) acts as a template for the dense oxide (e.g., anodic tantalum pentoxide ($Ta_2O_5$)), the geometry of the nano-structures 66 (grown into nano-pores 74) will substantially conform to the geometry of the nano-pores 74. Nano-structures 66 thus may take the form of substantially uniform columnar nano-pillars, substantially uniformly spaced across substrate surface 52.

The geometry and/or dimensions of the nano-structures 66 may further be controlled by adjusting one or more parameters of the anodization process. For example, referring to FIG. 3D, the nano-pillar pitch ($D_{pillar}$) (which is substantially equivalent to the nano-pore pitch ($D_{cell}$)) will depend on the anodization voltage used to form nano-structure template 72. The diameter ($d_{pillar}$) of the nano-pillars 66 (which is substantially equivalent to the nano-pore diameter ($d_{pore}$)) 11 will depend on the nature of the electrolyte selected and the current density used during the anodization of the second oxidizable material layer 70. The nano-pillar diameter ($d_{pillar}$) may also depend upon the degree of anisotropic etching, if any, used to further refine and define the nano-pores 74. The height (h) of the nano-pillars 66 will depend on the anodization voltage applied to the first oxidizable material layer 60 during its anodization. Other dimensions that may be derived from the pitch, the diameter, and the height h include the gap between the nano-pillars (i.e., $D_{pillar}-d_{pillar}$=gap) and the aspect ratio (i.e., $h/d_{pillar}$=aspect ratio) of the nano-pillars.

In non-limiting examples, the nano-pillars 66 may have i) a nano-pillar pitch ($D_{pillar}$) ranging from approximately 30 nanometers to approximately 500 nanometers, ii) a nano-pillar diameter ($d_{pillar}$) ranging from approximately 10 nanometers to approximately 350 nanometers, and iii) a height (h) of up to approximately 1000 nanometers. The gap between adjacent nano-pillars 66 may range from approximately 20 nanometers to approximately 490 nanometers.

Figure 3D:
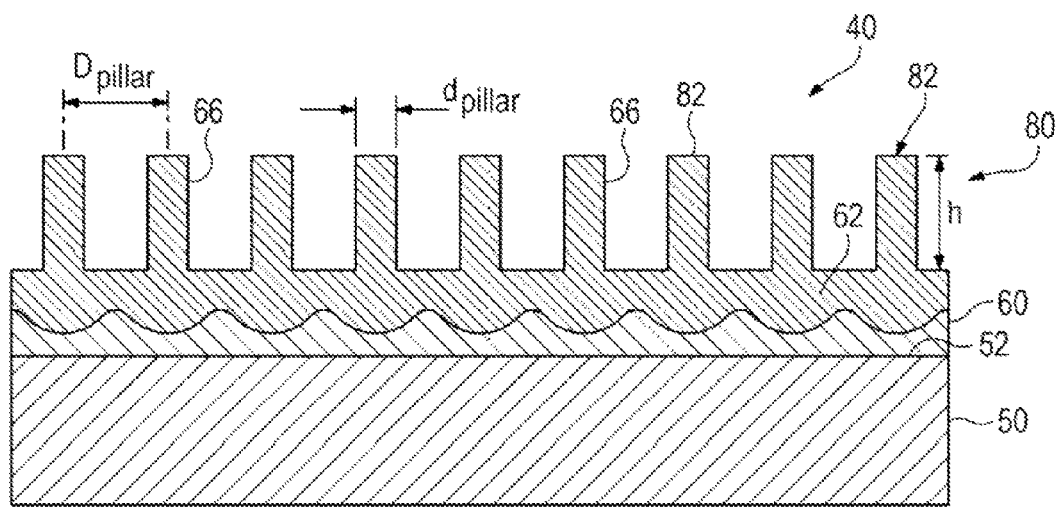

As indicated in FIG. 3D, once the nano-structures are grown to the desired height (h), the nano-structure template 72 is removed to expose nano-structures 66. The nano-structure template 72 may be removed using a selective etching process that will remove the layer of porous oxide without deleteriously affecting the nano-structures 66 or other features of article 40).

In one example, the selective etching is performed using a selective etchant containing $H_3PO_4$ (92 g), $CrO_3$ (32 g) and $H_2O$ (200 g), at approximately 95° C. It has been found that the example tantalum pentoxide ($Ta_2O_5$) nano-pillars 40 can withstand this particular etching process for more than one hour, while the example anodic porous alumina ($Al_2O_3$) nano-structure template 80 is etched away at a rate of about 1 micron per minute. Other selective etchants are also contemplated, dependent on the particular characteristics of the nano-structures.

Referring still to FIG. 3D, it will be seen that upon completing removal of nano-structure template 72, substrate 50 is left with a nano-structure array 80 formed on substrate surface 52. Article 40 thus will include a nano-structured surface 82. In the present example, the nano-structure array 80 may be characterized by plural substantially uniform nano-pillars 66, each formed of a dense oxide, such as tantalum pentoxide ($Ta_2O_5$). While nano-structures in the form of cylindrical nano-pillars are shown, other nano-structure configurations are also contemplated.

As noted previously, due at least in part to the change in surface morphology, nano-structured surface 82 may be characterized by a second wettability characteristic, different from the first wettability characteristic. The change in wettability characteristic will depend upon the material from which nano-structures 66 are formed, and the geometry of such nano-structures (including the change in surface area introduced by formation of the nano-structures). The wettability characteristic of nano-structured surface 82 may be referred to as modified wettability characteristic in view of the changes to wettability that may occur upon forming nano-structures on substrate surface 52. Such modified wettability characteristic, however, may not correspond to a desired wettability characteristic. Accordingly, further tuning of the wettability characteristic may be performed to move wettability of the substrate surface toward a desired target wettability characteristic (e.g., adjust the fluid contact angle $\theta_C$ of the nano-structured surface toward a target fluid contact angle).

Figure 3E:
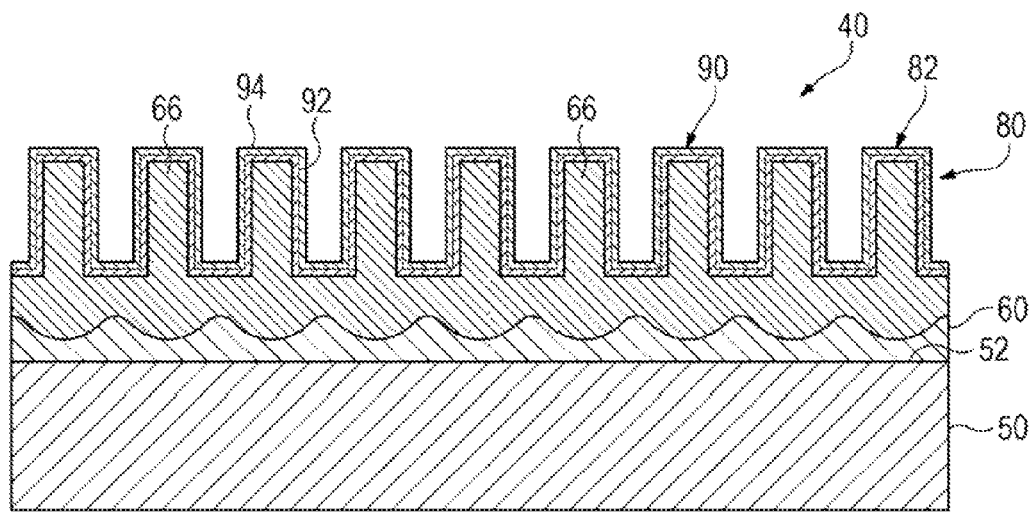

As indicated in FIG. 3E, nano-structured surface 82 may be tuned toward a target wettability characteristic by applying a thin-layer surface coating 90 onto the nano-structured surface. In some examples, the thin-layer coating 90 may include a layer deposited on the nano-structures 66 by a method such as atomic layer deposition (ALD). Non-limiting examples of materials that may be deposited to tune the wettability characteristic of a nano-structured surface include hafnium oxide ($HfO_2$), silicon oxide ($SiO_2$), zinc oxide (ZnO), aluminum oxide ($Al_2O_3$), titanium oxide ($TiO_2$), zirconium oxide ($ZrO_2$) and tungsten (W). As noted above, these materials may be deposited by atomic layer deposition, but other deposition techniques also may be possible.

In one example, thin-layer surface coating 90 includes a layer of hafnium oxide ($HfO_2$) deposited by ALD technique with the following conditions: vacuum—60 seconds, H2O adsorption—0.015 seconds, vacuum—60 seconds, $HfO_2$ precursor (tetrakis-[dimethylamido] hafnium (IV)) adsorption—0.15 seconds, where one cycle deposits 1 Angstrom of $HfO_2$. Nano-structures having a nano-pillar pitch ($D_{pillar}$) of approximately 83 nanometers and a nano-pillar diameter ($d_{pillar}$) of approximately 15 nanometers may be coated approximately 3 nanometers thick with $HfO_2$, which may drive the nano-structured surface from having a water contact angle on the order of 20° to having a water contact angle on the order of 60°.

In the foregoing example, nano-pillars 66 may be covered with hafnium oxide ($HfO_2$) to a desired thickness in increments of 1 Angstrom, allowing fine-tuning of pillar geometry (e.g., nano-pillar diameter ($d_{pillar}$)). Such adjustment to nano-structure geometry may allow for further fine-tuning of the nano-structured surface wettability characteristic toward a target wettability characteristic.

In some examples, thin-layer surface coating 90 may include a self-assembled monolayer on the nano-structured surface. The self-assembled monolayer may be selected to adjust a wettability characteristic of the nano-structured surface toward a target wettability characteristic. Materials such as 1H,1H,2H,2H-perfluorodecyltrichlorosilane (FDTS), heptadecafluoro-1,1,2,2-tetrahydrodecyl trichlorosilane (HDTS), tridecafluoro-1,1,2,2-tetrahydrooctyl trichlorosilane (FOTS) and octadecyltrichlorosilane (OTS) have been shown to provide suitable self-assembled monolayer materials for application to a nano-structured surface. Chemical compounds which will be effective as self-assembled monolayers are not limited to the examples provided herein.

As shown in FIG. 3E, thin-layer surface coating 90 may include multiple layers. A first layer 92 of thin-layer surface coating 90 may be selected to chemically alter nano-structured surface 82 and/or to prepare the nano-structured surface for receipt of a second layer 94 of thin-layer surface coating 90 (e.g., where the second layer is not well-suited for securement directly to the nano-structured surface). The first layer 92 thus may be configured to chemically bond the second layer 94 to nano-structure array 80. The first layer 92 also may be used to modify geometry of the nano-structures 66, allowing fine-tuning of the wettability characteristic of the nano-structured surface.

In an example, a first layer 92 of hafnium oxide ($HfO_2$) is applied to the nano-structured surface 82 (as described above) to chemically alter the nano-structured surface, and to prepare the nano-structured surface for receipt of a second layer 94 in the form of a self-assembled monolayer. The self-assembled monolayer may be 1H,1H,2H,2H-perfluorodecyltrichlorosilane (FDTS), and may be applied onto the layer of hafnium oxide by condensation reaction of FDTS and $H_2O$.

In another example, first layer 92 may be a monolayer of silicon oxide ($SiO_2$) is formed on the nano-structured surface by condensation reaction of $SiCl_4$ and $H_2O$. The first layer thus acts as a seed layer for use in chemically bonding the second layer (a self-assembled monolayer of FDTS in the present example) to the nano-structured surface.

In yet another example, an intermediate layer (not shown in FIG. 3E) is formed on first layer 92 to prepare the first layer for receipt of second layer 94. The first layer 92 may be a layer of hafnium oxide ($HfO_2$) applied to the nano-structured surface 82 by ALD technique to chemically alter the nano-structured surface. The intermediate layer may be a monolayer of silicon oxide ($SiO_2$) formed on the first layer 92 by condensation reaction of $SiCl_4$ and $H_2O$. The second layer may be a self-assembled monolayer of 1H,1H,2H,2H-perfluorodecyltrichlorosilane (FDTS) applied over the intermediate layer by condensation reaction of FDTS and $H_2O$. The intermediate layer thus may assist in chemically bonding second layer 94 to first layer 92, and thus to nano-structured surface 82.

In some examples, the target wettability characteristic may be defined as corresponding to a surface with a contact angle $\theta_C$ for a selected fluid that is greater than 90 degrees, and with a standard deviation across the surface that is on the order of 1 degree. In some examples, the target wettability characteristic may be defined as corresponding to a surface with a contact angle $\theta_C$ for water that is greater than or equal to 150 degrees with a standard deviation across the surface that is on the order of 1 degree. The thin-layer surface coating 90 may be selected to provide a reliably super-hydrophobic surface.

Figure 4:
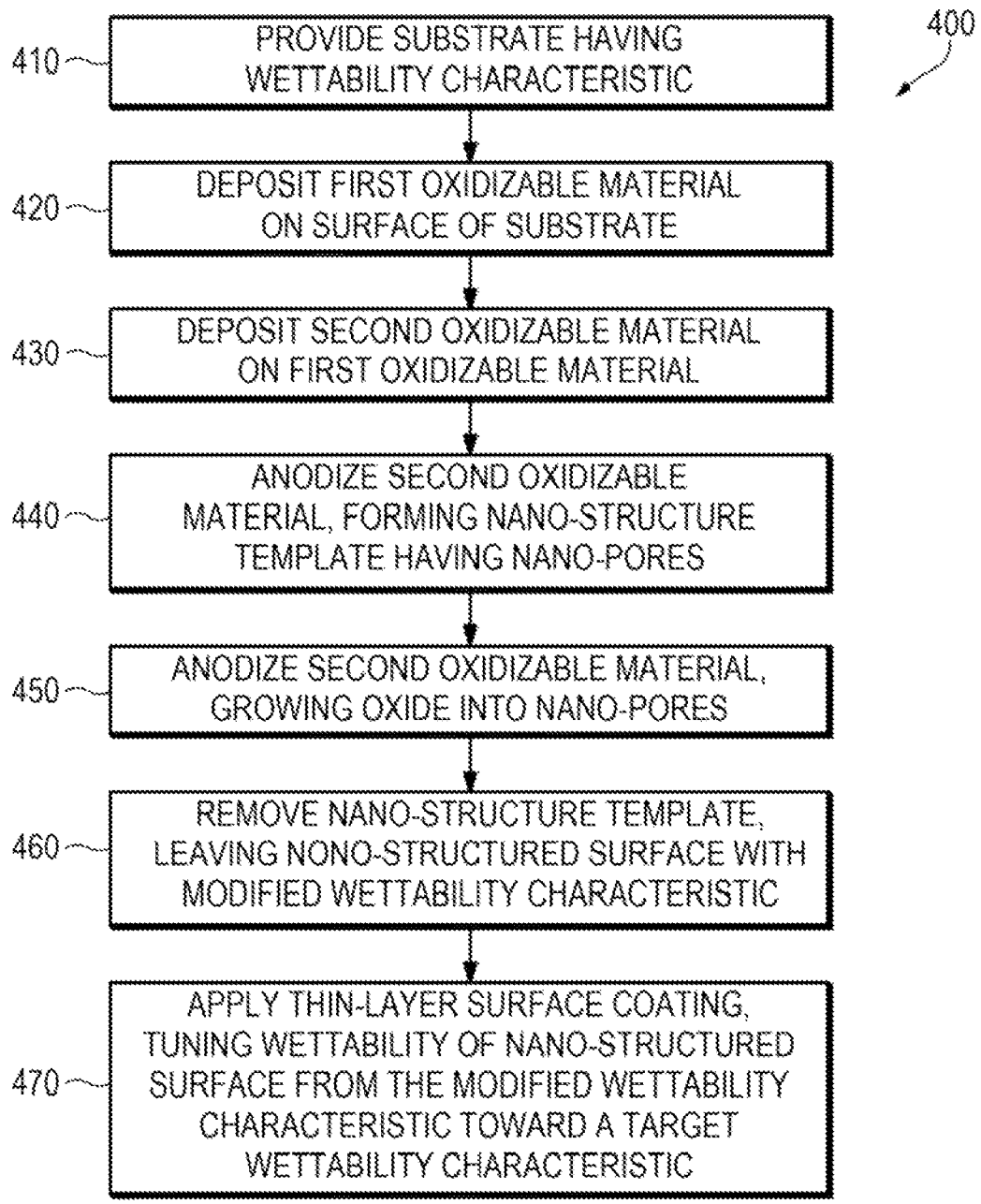
FIG. 4 is a flowchart showing a method of making a wettability-controlled article in accordance with an embodiment of the present invention.

FIG. 4 shows a high-level flowchart 400 of a method of controlling wettability of a surface of an article, as discussed above. The method generally includes: 1) forming an array of nano-structures on the surface of the article, the nano-structures providing a nano-structured surface with a modified wettability characteristic; and 2) applying a thin-layer surface coating onto to the array of nano-structures to tune the nano-structured surface from the modified wettability characteristic toward a target wettability characteristic.

At 410, a substrate is provided, the substrate having a surface with a wettability characteristic. A first oxidizable material is deposited on the surface of the substrate at 420. As indicated above, the first oxidizable material may be tantalum (Ta), and may form a first oxidizable material layer on the substrate. At 430, a second oxidizable material is deposited on the first oxidizable material. The second oxidizable material may be aluminum (Al), and may form a second oxidizable material layer on the first oxidizable material layer. At 440, the second oxidizable material is anodized, forming a nano-structure template having nano-pores. The nano-pores extend sufficiently through the resulting porous oxide template to provide for growth of oxide into the pores from the first oxidizable material below. At 450, the first oxidizable material layer is anodized, growing oxide into the nano-pores from below. The nano-pores thus are at least partially filled at least partially with a dense oxide such as tantalum pentoxide ($Ta_2O_5$) (where tantalum is used as the first oxidizable material). At 460, the nano-structure template is removed, leaving a nano-structured surface having a modified wettability characteristic. At 470, a thin-layer surface coating is applied, the thin layer surface coating being selected to tune wettability of the nano-structured surface from the modified wettability characteristic toward a target wettability characteristic.

The thin-layer surface coating may include plural layers. The first layer may be applied onto the nano-structured surface to chemically alter the nano-structured surface and/or to prepare the nano-structured surface for receipt of a second layer (e.g., where the second layer is not well-suited for securement directly to the nano-structured surface). The first layer may be a layer of hafnium oxide ($HfO_2$) applied to the nano-structured surface by ALD technique, or may be a monolayer of silicon oxide ($SiO_2$) formed on the nano-structured surface by condensation reaction of $SiCl_4$ and $H_2O$. The second layer may be applied to tune wettability of the nano-structured surface, and may take the form of a self-assembled monolayer of a material such as 1H,1H,2H,2H-perfluorodecyltrichlorosilane (FDTS) formed on the first layer by condensation reaction of FDTS and $H_2O$.

In some examples, the thin-layer surface coating may include a single layer formed directly on the nano-structured surface to tune wettability of the nano-structured surface, depending on the particular materials used to form the nano-structures, and the target wettability characteristic sought.

The thin layer coating also may include more than the first and second layers. For example, where the first layer is a layer of hafnium oxide ($HfO_2$), and the second layer is a self-assembled monolayer of FDTS, an intermediate monolayer of silicon oxide ($SiO_2$) may be employed to chemically bond the FDTS layer to the $HfO_2$ layer. The first and second layers may differentially cover the nano-structured surface, for example, where the intermediate layer covers only portions of the nano-structured surface to achieve different wettability characteristics in different regions of the substrate surface.

Although the present invention has been described with reference to certain representative embodiments, various modifications may be made to these representative embodiments without departing from the scope of the appended claims.

What is claimed is:

1. A method of controlling wettability of a surface of an article, the method comprising:
   forming an array of nano-structures on the surface, the nano-structures providing a nano-structured surface with a modified wettability characteristic, wherein forming the array of nano-structures on the surface includes:
      depositing a first oxidizable material on the surface;
      depositing a second oxidizable material on the first oxidizable material;
      anodizing the second oxidizable material to form a porous oxide having nano-pores;
      anodizing the first oxidizable material so as to at least partially fill the nano-pores with a dense oxide; and
      removing the porous oxide, thereby yielding a nano-pillar array on the surface;
   applying a thin-layer surface coating onto the nano-pillar array to tune wettability of the nano-structured surface from the modified wettabilty characteristic toward a target wettability characteristic, wherein applying the thin-layer surface coating includes forming a first layer on the nano-pillar array, and forming a second layer on the first layer, the first layer being configured to chemically bond the second layer to the nano-pillar array, the second layer being a self-assembled monolayer;
   wherein:
      the first oxidizable material is tantalum, and the nano-pillar array is an array of tantalum pentoxide ($Ta_2O_5$) nano-pillars;
      the second oxidizable material is aluminum;
      forming the first layer includes depositing hafnium oxide ($HfO_2$) on the nano-pillar array; and
      forming the second layer includes applying onto the first layer the self-assembled monolayer, the self-assembled monolayer being selected from the group consisting of 1H,1H,2H,2H-perfluorodecyltrichlorosilane (FDTS), heptadecafluoro-1,1,2,2-tetrahydrodecyl trichlorosilane (HDTS), tridecafluoro-1,1, 2,2-tetrahydrooctyl trichlorosilane (FOTS) and octadecyltrichlorosilane (OTS).

2. A method of controlling wettability of a surface of an article, the method comprising:
forming an array of nano-structures on the surface, the nano-structures providing a nano-structured surface with a modified wettability characteristic, wherein forming the array of nano-structures on the surface includes:
depositing a first oxidizable material on the surface;
depositing a second oxidizable material on the first oxidizable material;
anodizing the second oxidizable material to form a porous oxide having nano-pores;
anodizing the first oxidizable material so as to at least partially fill the nano-pores with a dense oxide; and
removing the porous oxide, thereby yielding a nano-pillar array on the surface;
applying a thin-layer surface coating onto the array of nano-structures to tune wettability of the nano-structured surface from the modified wettabilty characteristic toward a target wettability characteristic, wherein applying the thin-layer surface coating includes forming a first layer on the nano-pillar array, and forming a second layer on the first layer, the first layer being configured to chemically bond the second layer to the nano-pillar array, the second layer being a self-assembled monolayer;
wherein:
the first oxidizable material is tantalum, the second oxidizable material is aluminum, and the nano-pillar array is a substantially uniformly spaced array of tantalum pentoxide ($Ta_2O_5$) nano-pillars;
forming the first layer includes depositing hafnium oxide ($HfO_2$) by atomic layer deposition to a thickness of less than half a distance between adjacent nano-pillars; and
forming the second layer includes applying a self-assembled monolayer of 1H,1H,2H,2H-perfluorodecyltrichlorosilane (FDTS) onto the first layer.

3. The method of claim 1, wherein the self-assembled monolayer renders the nano-structured surface super-hydrophobic.

4. A method of controlling wettability of a surface of an article, the method comprising:
forming a substantially uniformly spaced array of tantalum pentoxide ($Ta_2O_5$) nano-pillars on the surface through an anodization process, the nano-pillars providing a nano-structured surface with a modified wettability characteristic;
applying a thin-layer surface coating onto the array of tantalum pentoxide ($Ta_2O_5$) nano-pillars to tune wettability of the nano-structured surface from the modified wettabilty characteristic toward a target wettability characteristic;
wherein applying the thin-layer surface coating includes:
depositing onto the array of tantalum pentoxide ($Ta_2O_5$) nano-pillars a first layer of hafnium oxide ($HfO_2$), the depositing being accomplished by atomic layer deposition to a thickness of less than half a distance between adjacent nano-pillars; and
forming a second layer by applying a self-assembled monolayer of 1H,1H,2H,2H-perfluorodecyltrichlorosilane (FDTS) onto the first layer.

* * * * *